(12) United States Patent
Ono

(10) Patent No.: US 6,906,405 B2
(45) Date of Patent: Jun. 14, 2005

(54) ELECTRONIC PART AND ITS MANUFACTURING METHOD

(75) Inventor: Koji Ono, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 4 days.

(21) Appl. No.: 10/465,221

(22) Filed: Jun. 20, 2003

(65) Prior Publication Data

US 2003/0214024 A1 Nov. 20, 2003

Related U.S. Application Data

(62) Division of application No. 10/036,515, filed on Jan. 7, 2002, now abandoned.

(30) Foreign Application Priority Data

Jan. 10, 2001 (JP) ........................................ 2001-002577
Dec. 28, 2001 (JP) ........................................ 2001-400613

(51) Int. Cl.[7] .......................... H01L 23/02; H01L 29/20
(52) U.S. Cl. ........................... 257/680; 257/98; 257/99; 257/783; 257/793; 257/794
(58) Field of Search ........................ 257/98, 99, 680, 257/783, 787, 673, 793, 794, E51.018, E33.002, 644

(56) References Cited

U.S. PATENT DOCUMENTS

| | | | |
|---|---|---|---|
| 5,079,190 A | 1/1992 | Mihara | 437/220 |
| 5,081,347 A | 1/1992 | Matsumoto | 250/211 J |
| 5,506,401 A | 4/1996 | Segawa et al. | 250/208.1 |
| 5,786,589 A | 7/1998 | Segawa et al. | 250/208.1 |
| 5,998,862 A | 12/1999 | Yamanaka | 257/704 |
| 6,384,473 B1 | 5/2002 | Peterson et al. | 257/680 |
| 6,492,699 B1 | 12/2002 | Glenn et al. | 257/433 |
| 6,525,356 B1 | 2/2003 | Murakami et al. | 257/294 |

FOREIGN PATENT DOCUMENTS

| | | | | |
|---|---|---|---|---|
| EP | 1 409 179 A2 | * | 11/2000 | H01L/33/00 |
| JP | 63-33877 | * | 2/1988 | H01L/33/00 |
| JP | 64-35941 | * | 7/1989 | H01L/23/28 |
| JP | 4-165673 | * | 6/1992 | 257/433 |
| JP | 7-99214 | | 4/1995 | |
| JP | 8-116042 | * | 5/1996 | H01L/27/14 |

OTHER PUBLICATIONS

U.S. Appl. No. 09/938,571, filed Aug. 27, 2001.
U.S. Appl. No. 10/005,697, filed Dec. 7, 2001.
U.S. Appl. No. 09/344,509, filed Jun. 25, 1999.
U.S. Appl. No. 09/813,846, filed Mar. 22, 2001.

* cited by examiner

Primary Examiner—Jasmine Clark
(74) Attorney, Agent, or Firm—Fitzpatrick, Cella, Harper & Scinto

(57) ABSTRACT

An electronic part comprising: a functional element chip on which a functional element has been formed; a wiring member which is electrically connected to the functional element chip; and a protecting member for protecting the functional element chip, wherein the wiring member has a stair shape and is electrically connected to the functional element chip, so that an electronic part having a functional element chip which is hard to be distorted.

An electronic part comprising: a functional element chip on which a functional element has been formed; and a protecting member for protecting the functional element chip, wherein a spacer is sandwiched between the functional element chip and the protecting member, so that a constant gap between a functional element chip and a protecting cap is easily held.

10 Claims, 11 Drawing Sheets

ELECTRONIC PART AND ITS MANUFACTURING METHOD

This application is a divisional application of application Ser. No. 10/036,515, filed Jan. 7, 2002 now abandoned.

BACKGROUND OF THE INVENTION

1. Field of the Invention

The invention relates to an electronic part such as solid state image pick-up apparatus, light emitting apparatus, display apparatus, or the like and to a manufacturing method of such an electronic part. More particularly, the invention relates to an electronic part comprising a terminal of a functional element chip, a wiring member which is electrically connected to the terminal, and an adhesive material for adhering the functional element chip and a protecting member and to a manufacturing method of such an electronic part.

2. Related Background Art

Hitherto, as a kind of electronic part, an apparatus such that light information can be converted into an electric signal, the electric signal can be converted into the light information, light can be emitted or modulated by the electric signal, or an optical path can be changed by the electric signal has been known. An apparatus having functional elements has been known as such a kind of apparatus. As functional elements, a photosensitive element, a light emitting element, a DMD (Digital Micromirror Device), and the like have been known.

Among them, a solid state image pick-up apparatus having a photosensitive element array will be explained as an example of the electronic part. The solid state image pick-up apparatus is often provided in an image inputting apparatus such as video camera, digital still camera, or the like. According to such a solid state image pick-up apparatus, a photodiode serving as a photosensitive element, a CCD serving as a drive reading circuit, a CMOS, and the like are integrated on a semiconductor substrate such as a silicon wafer or the like, an integrated circuit is formed, and thereafter, a color filter and a microlens are formed above an image pick-up area (effective pixel area) by using an acrylic material or the like.

The silicon wafer on/over which the integrated circuit, color filter, and microlens have been formed is cut by performing a dicing process so as to obtain a chip. The resultant chip is enclosed in a ceramics package or the like. The chip and leads are electrically connected by a wire-bonding process or the like. After that, a protecting cap of a glass substrate is adhered onto the package, thereby protecting the chip against the ambient atmosphere.

In recent years, miniaturization of the image inputting apparatus such as a digital camera or the like has been progressed. Thus, it is also demanded to miniaturize and thin the solid state image pick-up apparatus. For example, the method of miniaturizing the solid state image pick-up apparatus has been disclosed in JP-A-7-099214.

FIG. 15 is a cross sectional view of a solid state image pick-up apparatus as an example of the conventional electronic parts. In FIG. 15, reference numeral 1 denotes a solid state image pick-up element chip; 2 a solid state image pick-up element; 3 a protecting cap; 4 a TAB (Tape-Automated Bonding) tape serving as a wiring and constructed by an insulative film 41 and a beam lead 42; 5 an electrode pad; 6 a bump; 11 an adhesive material; 12 an anisotropic conductive adhesive material; and 13 a sealing resin.

According to the solid state image pick-up apparatus shown in FIG. 15, first, the protecting cap 3 and TAB tape 4 are adhered via the light transparent adhesive material 11. The electrode pad 5 is formed on the solid state image pick-up element chip 1 having the solid state image pick-up element 2 and a microlens (not shown). Further, the bump 6 is formed on the electrode pad 5. The anisotropic conductive adhesive material 12 is coated onto the bump 6 and its peripheral areas by a dispenser or the like. The TAB tape 4 adhered to the protecting cap 3 by the adhesive material 11 is positioned to the solid state image pick-up element chip 1 and, thereafter, the bump 6 and TAB tape 4 are thermo-compression bonded. Thus, the solid state image pick-up apparatus shown in FIG. 15 is obtained.

Manufacturing steps of the conventional electronic part will be described with reference to FIGS. 16A to 16C. As an example of the electronic parts, the manufacturing steps of a prior art in which a gap between the solid state image pick-up element chip 1 and protecting cap 3 is held to be constant are shown here.

First, in FIG. 16A, reference numeral 13 denotes the solid state image pick-up element fixing tool; 14 a protecting cap holding tool; and 15 a gap control pin.

An explanation of the component elements having the same reference numerals as those described already is omitted here.

First, as shown in FIG. 16A, the solid state image pick-up element chip 1 to which the TAB tape 4 is electrically connected through the electrode pad 5 and bump 6 is put on the solid state image pick-up element fixing tool 13. The protecting cap 3 is fixed to the protecting cap holding tool 14. The gap control pin 15 is attached to the protecting cap holding tool 14.

Subsequently, as shown in FIG. 16B, the solid state image pick-up element fixing tool 13 and protecting cap holding tool 14 are overlaid. At this time, the gap control pin 15 is come into contact with the solid state image pick-up element fixing tool 13 and the gap between the solid state image pick-up element chip 1 and protecting cap 3 is controlled.

In this state, as shown in FIG. 16C, outer peripheral portions of the solid state image pick-up element chip 1 and protecting cap 3 are sealed by a sealing resin 9.

(Technical Problem 1)

However, in the solid state image pick-up apparatus shown in FIG. 15, if a coefficient of thermal expansion of the solid state image pick-up element chip 1 and that of the protecting cap 3 are different, a distortion occurs in the solid state image pick-up element chip 1 due to heating in the manufacturing steps or due to a temperature change which is caused when the apparatus is used, or since a pressure of the air in the package changes due to the temperature change which is caused when the apparatus is used, a distortion occurs in the solid state image pick-up element chip 1. If the distortion occurs in the solid state image pick-up element chip 1, a focal position differs every pixel of the solid state image pick-up element 2 and picture quality deteriorates. In addition, there is also a case where the TAB tape 4 is peeled from the bump 6 due to a stress by such a distortion and the electric connection between the TAB tape 4 and solid state image pick-up element chip 1 is disconnected. Further, there is also a case where a phenomenon such that the protecting cap 3, adhesive material 11, TAB tape 4, and anisotropic conductive adhesive material 12 are peeled from each interface of the sealing resin 13 occurs.

(Technical Problem 2)

In the manufacturing steps of the solid state image pick-up apparatus shown in FIGS. 16A to 16C, since the control of the gap between the solid state image pick-up element chip 1 and protecting cap 3 is largely influenced by a variation of a glass thickness, a variation of a chip thickness, or precision of the tool, the gap cannot be accurately controlled. Specifically speaking, according to the conventional gap control using the gap control pin 15, although the gap between an upper surface of the protecting cap 3 (surface which does not face the solid state image pick-up element chip) and a lower surface of the solid state image pick-up element chip 1 (surface which does not face the protecting cap) is controlled, the gap between the surfaces of the protecting cap 3 and solid state image pick-up element chip 1, that is, the gap between the surfaces which face each other is not controlled- Therefore, if there is (are) a variation (variations) of the glass thickness or/and the chip thickness, the gap between the surfaces of the solid state image pick-up element chip 1 and protecting cap 3 which face each other cannot be held to be constant, so that a variation occurs. Consequently, reliability of the electric connection between the TAB tape 4 and solid state image pick-up element chip 1 cannot be assured. Thus, optical characteristics of the solid state image pick-up element 2 are adversely influenced. On the other hand, if it is intended to adhere the solid state image pick-up element chip 1 and protecting cap 3 while keeping the gap between the surfaces of them which face each other at high precision, high precision is required in a laminating apparatus, its construction becomes complicated, and the apparatus eventually becomes expensive.

It is, therefore, an object of the invention to improve electric reliability of an electronic part and cheaply provide an electronic part Another object of the invention is to provide a cheap electronic part of high reliability while keeping a constant interval between a functional element chip and a protecting member.

In the specification, the gap between the surfaces of the solid state image pick-up element chip 1 and protecting cap 3 which face each other is simply referred to as a "gap" hereinbelow.

In the specification, the stress which causes a difference between the coefficients of thermal expansion of the solid state image pick-up element chip 1 and protecting cap 3 is simply referred to as a "stress" hereinbelow.

SUMMARY OF THE INVENTION

To solve the technical problem 1, therefore, it is an object of the invention to provide an electronic part having a functional element chip which is hard to be distorted.

To solve the technical problem 1, therefore, it is another object of the invention to provide an electronic part in which an electric connection between a functional element chip and a wiring member is hard to be disconnected.

To accomplish the object regarding the technical problem 1, according to the invention, there is provided an electronic part comprising: a functional element chip on which a functional element has been formed; a wiring member which is electrically connected to the functional element chip; and a protecting member for protecting the functional element chip, wherein the wiring member has a stair shape and is electrically connected to the functional element chip.

To accomplish the object regarding the technical problem 1, according to the invention, there is provided a manufacturing method of an electronic part having a functional element chip on which a functional element has been formed, a wiring member which is electrically connected to the functional element chip, and a protecting member for protecting the functional element chip, comprising the steps of: electrically connecting the functional element chip and the wiring member; and adhering the protecting member and the wiring member by using an adhesive material so as to have a stair shape.

To solve the technical problem 2, therefore, it is an object of the invention to provide a cheap electronic part with high reliability in which a constant gap between a functional element chip and a protecting cap is easily held.

To accomplish the object regarding the technical problem 2, according to the invention, there is provided an electronic part comprising: a functional element chip on which a functional element has been formed; and a protecting member for protecting the functional element chip, wherein a spacer is sandwiched between the functional element chip and the protecting member.

To accomplish the object regarding the technical problem 2, according to the invention, there is provided a manufacturing method of an electronic part having a functional element chip on which a functional element has been formed and a protecting member for protecting the functional element chip, comprising the steps of: coating a resin serving as a spacer onto the functional element chip or the protecting member; and curing the coated resin.

DETAILED DESCRIPTION OF THE PREFERRED EMBODIMENTS

Embodiments of the present invention will now be described hereinbelow with reference to the drawings.

(Embodiment 1)

Figure 1A:
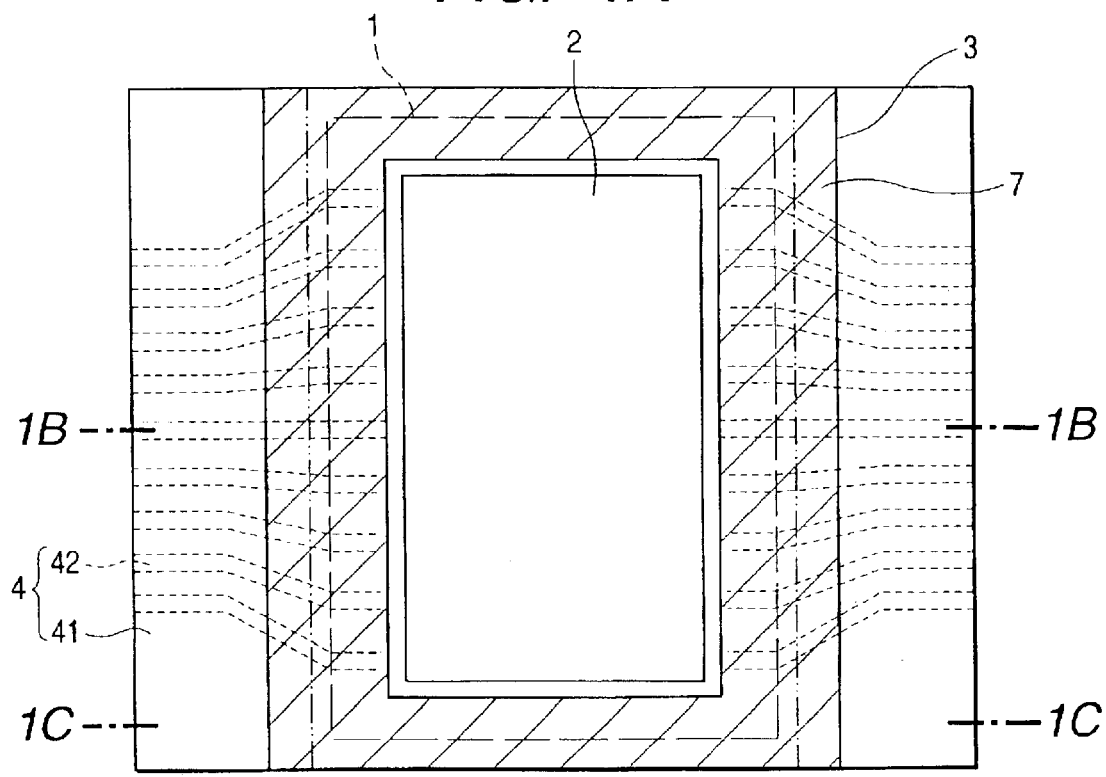
FIG. 1A is a top plan view of a solid state image pick-up apparatus as an electronic part according to the first embodiment of the invention.

FIG. 1A is a top plan view of a solid state image pick-up apparatus as an electronic part according to the embodiment 1 of the invention.

Figure 1B:
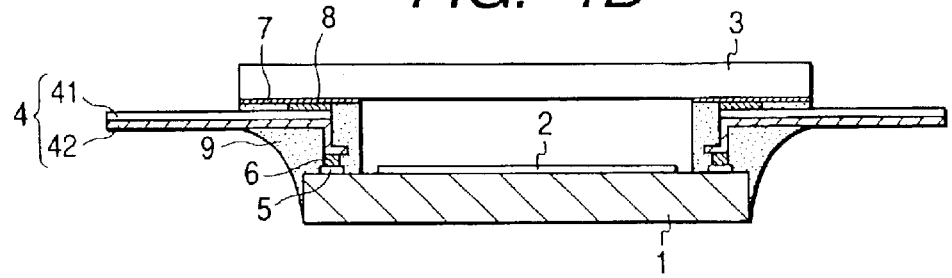
FIG. 1B is a cross sectional view taken along the broken line 1B—1B in FIG. 1A.

FIG. 1B is a cross sectional view taken along the broken line 1B—1B in FIG. 1A.

Figure 1C:
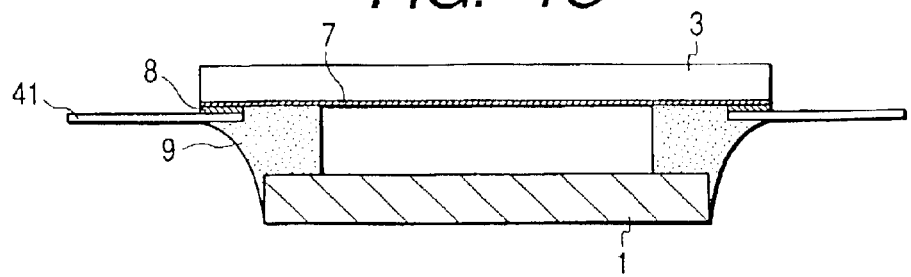
FIG. 1C is a cross sectional view taken along the broken line 1C—1C in FIG. 1A.

FIG. 1C is a cross sectional view taken along the broken line 1C—1C in FIG. 1A.

In the electronic part, reference numeral 1 denote the functional element chip; 2 the functional element formed on the functional element chip; 3 the protecting member for protecting the functional element chip; and 4 the wiring member electrically connected to the functional element chip 1.

In the present specification, a region where the TAB tape 4 and solid state image pick-up element chip 1 are electrically connected is referred to as a "connecting region", and a region where the TAB tape 4 and protecting cap 3 are adhered is referred to as an "adhesive region".

Hereinafter, in the specification, a direction of a plane of the solid state image pick-up element chip 1 on which the solid state image pick-up element 2 has been mounted is referred to as a "horizontal direction", on the other hand, a vertical direction is simply referred to as a "vertical direction" as compared with the horizontal direction.

As will be explained in detail hereinbelow, in the embodiment, explanation will be made with respect to the solid state image pick-up apparatus as an example of the electronic parts. As a functional element chip 1, for example, the solid state image pick-up element chip 1 in which a plurality of photoelectric converting elements and a microlens (which are not shown) have been formed can be used. The bump 6 made of gold or the like is provided as a terminal. Reference numeral 4 denotes the TAB (Tape-Automated Bonding) tape in which the gold-plated conductive beam lead 42 made of nickel alloy, copper, or the like is provided on the insulative tape film 41 consisting of polyimide as a main component as a wiring member. Further, reference numeral 3 denotes the light transparent protecting cap serving as a protecting member for protecting the solid state image pick-up element chip 1 in the embodiment. The protecting cap 3 is arranged on the side of the solid state image pick-up element chip 1 where the solid state image pick-up element 2 has been formed. The protecting cap 3 is made of a plate-like glass which transmits the light, for example, no-alkali glass, quartz, or the like. A protecting cap made of a transparent resin, for example, acryl can be also used. As a protecting cap 3, a reflection preventing film, an optical low pass filter, or an infrared cutting filter can be solely laminated onto the protecting cap 3 or they can be combined and laminated thereon as necessary. Reference numeral 7 denotes a light shielding member (light shielding mask) made of a light absorber such as black epoxy resin or the like formed in the peripheral portion of the protecting cap 3, for example, on the side of the solid state image pick-up element chip 1. The light shielding member 7 is provided at a periphery so as to cover the bump 6 and copper lead 42 in order to prevent a situation such that the incident light is irregularly reflected or the like by the bump 6 and beam lead 42, so that the unnecessary light enters the solid state image pick-up element 2 and exercises an adverse influence on an image. Reference numeral 9 denotes the sealing resin as a sealing material. The sealing resin 9 has flexibility and is made of, for example, an urethane system, silicone system, styrene system, ester system, vinyl chloride system, epoxy system, or the like.

In the invention, it is preferable that the sealing resin 9 has flexibility. This is because if the sealing resin 9 itself has flexibility, the stress can be lessened. Therefore, the resin of the epoxy system, or the like is modified in the embodiment, the resin 9 which is compounded of plasticizers or elastomers is used.

It is preferable that an elastic modulus of the sealing resin 9 is equal to or less than 300 MPa. This is because if the elastic modulus is equal to or less than 300 MPa, the flexibility which can lessen the stress can be obtained.

More preferably, it is desirable that the elastic modulus of the sealing resin 9 is set to a value that is optimized so as to lessen the stress which is applied to the solid state image pick-up element chip 1. In the embodiment, the resin having an elastic modulus of, for example, about 150 MPa is used.

In this embodiment, the sealing resin 9 is formed to cover the beam lead 42 of the TAB tape 4 at a place near the connecting region and to surround the whole periphery of the solid state image pick-up element chip 1 lest the beam lead 42 is exposed. By surrounding the whole periphery as mentioned above, air-tightness of a space between the solid state image pick-up element chip 1 and protecting cap 3 is held, so that in addition to an effect of shutting off the light, moisture resistance of the electronic part can be also improved. But, if electronic part is not necessary to have an air-tightness or doesn't have to shut off the light or moisture resistance doesn't matter, a plurality of sealing resins 9 can be discretely formed at a plurality of positions along the periphery of the solid state image pick-up element chip 1 or it is not always necessary to form the sealing resin 9.

The TAB tape 4 as a wiring member has a stair shape. Specifically speaking, assuming that the plane of the solid state image pick-up element chip 1 on which the solid state image pick-up element 2 has been formed is used as a reference of height, the connecting region of the TAB tape 4 and the adhesive region of the TAB tape 4 are formed so as to have different heights.

The wiring member is adhered to the protecting cap 3 by a liquid type adhesive material or an adhesive material sheet 8 is used as an adhesive material.

In this embodiment an adhesive material sheet 8 is used as an adhesive material. The adhesive material sheet 8 is made of a thermoplastic resin, a thermo-setting resin, or their mixed resin. As an example of an adhering method using the mixed resin, the resin in an initial state is a solid instead of a liquid by using characteristics of the thermoplastic resin and temporarily adhered onto one of the members to be adhered at a low temperature. Subsequently, the other member to be adhered is laminated and, in this state, the resin is actually adhered at a high temperature by using characteristics of the thermo-setting resin.

The thermo-setting resin is used in the embodiment.

By using such a sheet-like adhesive material as mentioned above, the thickness can be easily controlled and an overflow of the unnecessary adhesive material can be prevented.

Further, by fixing the resin by using a curing-type adhesive material, if a mechanical stress is applied to the wiring member from the outside, the stress is received in the adhesive region, so that the stress from the outside is hardly transferred to the connecting region. Consequently, the electrical connection is hardly disconnected.

Therefore, it is desirable that the sealing resin has the flexibility and the adhesive material is the curing-type material. In other words, it is preferable that the elastic modulus of the sealing resin is lower than that of the adhesive material.

In the embodiment, the adhesive region is provided on the base edge portion side of the TAB tape 4 closer than the connecting region.

The stair shape in the embodiment will be further described in detail. Referring to FIG. 1B, assuming that the direction of the surface of the solid state image pick-up element chip 1 on which the solid state image pick-up element 2 has been formed is set to the horizontal direction, such a stair shape is a shape in which the TAB tape 4 which wires the connecting region and the adhesive region is arranged in the direction perpendicular to the horizontal direction.

Figure 15:
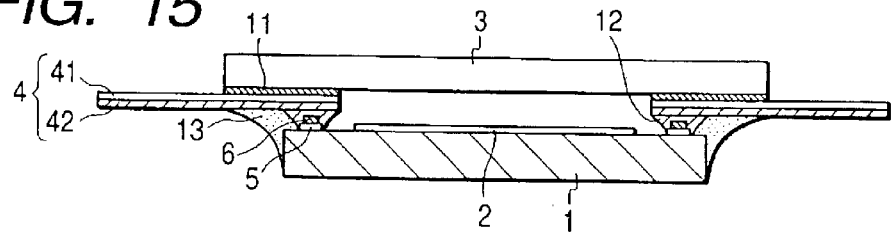
FIG. 15 is a cross sectional view of a solid state image pick-up apparatus as a conventional electronic part.
Figure 16A:
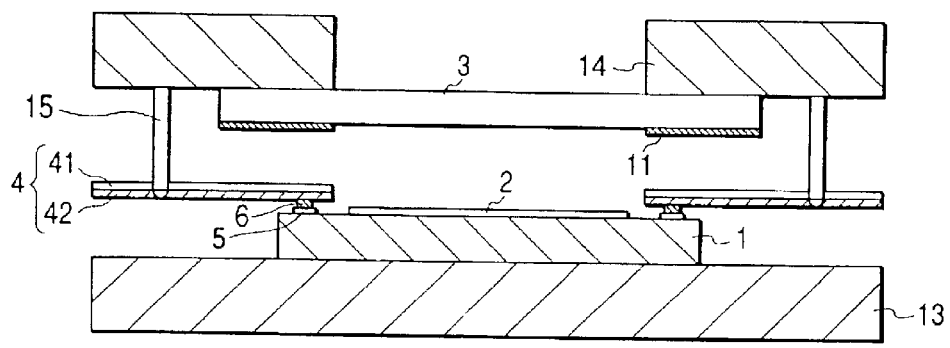
FIGS. 16A, 16B, and 16C are step diagrams showing a manufacturing method of the solid state image pick-up apparatus as a conventional electronic part.
Figure 16B:
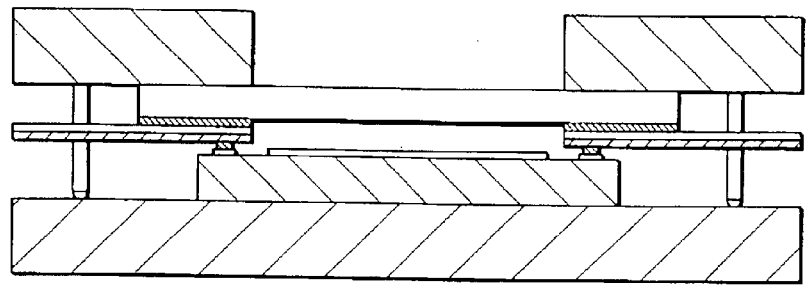
Figure 16C:
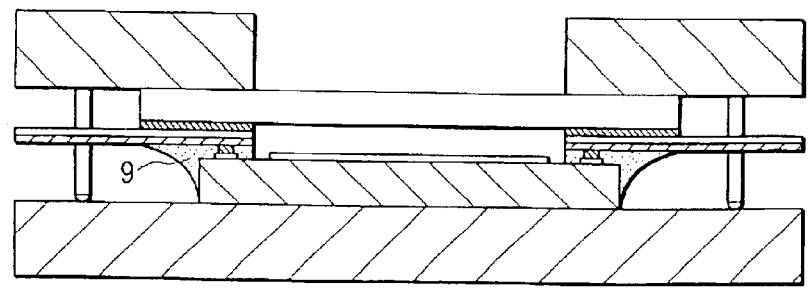

Hitherto (for example, FIG. 15), since the connecting region and the adhesive region are formed in the same region of the TAB tape 4 in the front edge portion of the TAB tape 4, the stress which is caused because the coefficient of thermal expansion of the protecting cap 3 is different from that of the solid state image pick-up element chip 1 is transferred to the connecting region without being lessened. There is, consequently, a problem such that the solid state image pick-up element chip 1 is distorted or the TAB tape 4 and bump 6 are peeled off. According to the embodiment, such a problem is solved by a method whereby the TAB tape 4 is formed in a stair shape and the connecting region and the adhesive region are physically away from each other, thereby lessening the stress due to expansion/contraction performance of the TAB tape 4 between the adhesive region and the connecting region.

As described above, the electronic part of the invention is characterized in that the distortion of the functional element chip is difficult to occur.

In addition, the electronic part of the invention is characterized in that the wiring member and the functional element chip are difficult to be peeled off.

The electronic part of the invention is characterized in that in case of using the curing-type and high elastic modulus adhesive material as an adhesive material, even if a stress is applied to the wiring member from the outside, the wiring member and the functional element chip are difficult to be peeled off.

(Embodiment 2)

Figure 2:
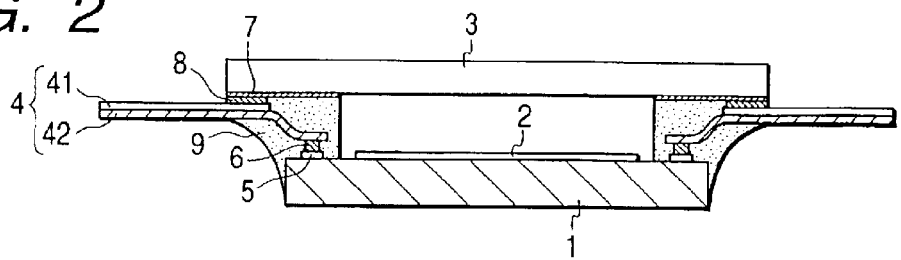
FIG. 2 is a schematic cross sectional view of a solid state image pick-up apparatus as an electronic part according to the second embodiment of the invention.

FIG. 2 is a schematic cross sectional view of a solid state image pick-up apparatus as an electronic part according to the embodiment 2 of the invention.

Explanation regarding the component elements designated by the same reference numerals as those of the component elements which have already been described above is omitted here.

The embodiment 2 differs from the embodiment 1 with respect to the stair shape of the TAB tape 4. specifically speaking, those embodiments are the same with respect to a point that assuming that the surface of the solid state image pick-up element chip 1 on which the solid state image pick-up element 2 has been formed is set to the reference of the height, the connecting region of the TAB tape 4 and the adhesive region of the TAB tape 4 are formed so as to have the different heights in a manner similar to the embodiment 1. Those embodiments are different with respect to the following point. That is, in the embodiment 1, the TAB tape 4 between the connecting region and the adhesive region is wired in the vertical direction. However, in the embodiment 2, since the connecting region and the adhesive region are arranged at the different positions regarding the horizontal direction, the wiring between them is arranged in an oblique direction other than the vertical direction.

By setting such a stair shape, for example, when a stress is applied from the outside to the solid state image pick-up element chip 1 in the vertical direction or the oblique direction, since the stress can be distributed in the vertical direction and the horizontal direction, the solid state image pick-up element chip 1 is hard to be distorted. Therefore, the shape in the embodiment 2 is more preferable than that in the embodiment 1 with respect to a point that the stress from the outside can be lessened.

Further, also with respect to the stress which is caused due to the difference between the coefficients of thermal expansion of the solid state image pick-up element chip 1 and protecting cap 3, as compared with the TAB tape 4 in which the connecting region and the adhesive region is wired in the vertical direction as in the embodiment 1 and which has the stair shape of the same height as that in the embodiment 1, according to the embodiment 2, the physical distance of the TAB tape 4 between the connecting region and the adhesive region is longer than that of the TAB tape 4 in the embodiment 1 by a distance corresponding to the portion between the connecting region and the adhesive region arranged in the oblique direction. Therefore, the expansion/contraction performance is improved and the further large stress can be lessened.

In the embodiment 2, the adhesive region is provided on the base edge portion side of the TAB tape 4 closer than the connecting region.

(Embodiment 3)

Figure 3:
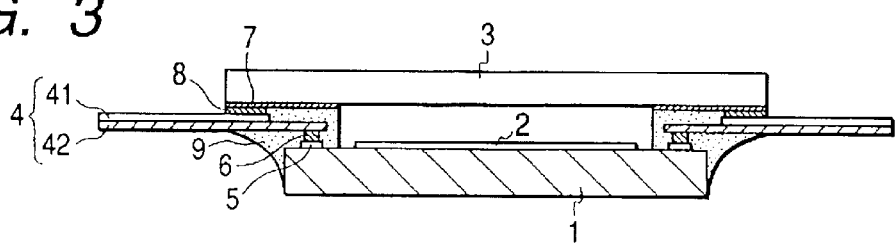
FIG. 3 is a schematic cross sectional view of a solid state image pick-up apparatus as an electronic part according to the third embodiment of the invention.

FIG. 3 is a schematic cross sectional view of a solid state image pick-up apparatus as an electronic part according to the embodiment 3 of the invention.

Explanation regarding the component elements designated by the same reference numerals as those of the component elements which have already been described above is omitted here.

The embodiment 3 differs from the embodiments 1 and 2 with respect to a point that the TAB tape 4 does not have the stair shape.

Specifically speaking, assuming that the surface of the solid state image pick-up element chip 1 on which the solid state image pick-up element 2 has been formed is set to a reference of the height, the connecting region of the TAB tape 4 and the adhesive region of the TAB tape 4 are formed so as to have the same height. Further, at a front edge portion of the TAB tape 4, a connecting region with the solid state image pick-up element chip 1 is formed. An adhesive region with the protecting cap 3 is formed on the base edge portion side closer than the front edge portion of the TAB tape 4. In the embodiment 3, a flexible resin is used as a sealing resin 9 and a curing-type adhesive material is used as an adhesive material.

Therefore, unlike the conventional construction (for example, FIG. 15), the connecting region and the adhesive region of the TAB tape 4 are not formed in the same region on the TAB tape 4. That is, since the connecting region and the adhesive region are formed so as to be physically away from each other, the stress can be lessened by the TAB tape 4 provided between them.

(Embodiment 4)

Figure 4:
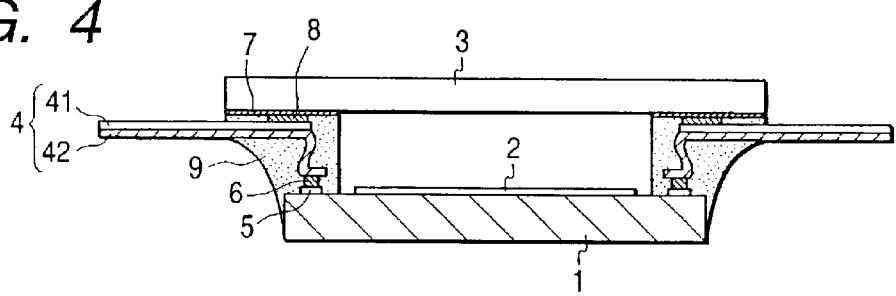
FIG. 4 is a schematic cross sectional view of a solid state image pick-up apparatus as an electronic part according to the fourth embodiment of the invention.

FIG. 4 is a schematic cross sectional view of a solid state image pick-up apparatus as an electronic part according to the embodiment 4 of the invention.

Explanation regarding the component elements designated by the same reference numerals as those of the component elements which have already been described above is omitted here.

The embodiment 4 differs from the embodiments 1 and 2 with respect to a stair shape of the TAB tape 4.

Specifically speaking, according to the embodiment 1, the TAB tape 4 is arranged in the vertical direction at the shortest distance from the connecting region to the adhesive region. In the embodiment 4, the TAB tape 4 longer than the shortest distance is arranged between the connecting region and the adhesive region.

Further explaining in detail, in the embodiments 1 and 2, the stress is lessened by the expansion/contraction performance which the TAB tape 4 itself has. However, according to the embodiment 4, by wiring the adhesive region and the connecting region by the TAB tape 4 longer than the shortest distance, the stress can be lessened by stretching the surplus TAB tape 4. Therefore, a structure such that the stress is further difficult to be transferred to the connecting region is obtained. Even if the surplus TAB tape 4 is fully stretched, the stress can be further lessened by the expansion/contraction performance which the TAB tape 4 itself has.

Also in the embodiment 4, the adhesive region is provided on the base edge portion side of the TAB tape 4 closer than the connecting region in a manner similar to other embodiments.

As described above, according to the embodiment 4, the stress which is further larger than those in the embodiments 1 and 2 can be lessened and the electronic part in which the functional element chip is difficult to be distorted can be provided.

In addition, the electronic part in which the electric connection of the wiring member and the functional element chip is difficult to be peeled off can be provided.

(Embodiment 5)

Figure 5:
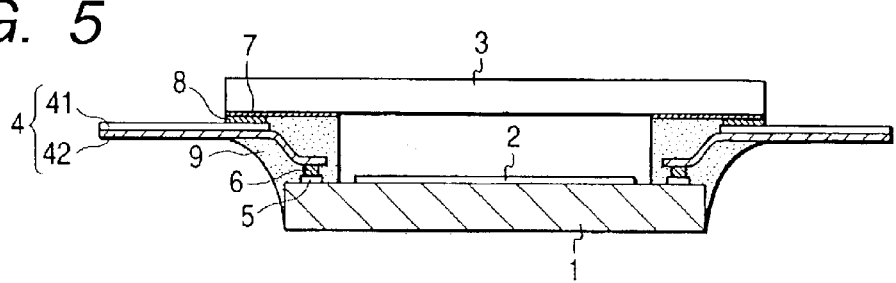
FIG. 5 is a schematic cross sectional view of a solid state image pick-up apparatus as an electronic part according to the fifth embodiment of the invention.

FIG. 5 is a schematic cross sectional view of a solid state image pick-up apparatus as an electronic part according to the embodiment 5 of the invention.

Explanation regarding the component elements designated by the same reference numerals as those of the component elements which have already been described above is omitted here.

The embodiment 5 differs from the embodiment 4 with respect to the stair shape of the TAB tape 4. Specifically speaking, according to the embodiment 4, as a TAB tape 4 which is wired in the vertical direction from the connecting region to the adhesive region at the shortest distance, the TAB tape 4 longer than the shortest distance is used. In the embodiment 5, as a TAB tape 4 which is wired in the oblique direction from the connecting region to the adhesive region at the shortest distance, the TAB tape 4 longer than the shortest distance is used.

Further explaining, the connecting region and the adhesive region are formed at different positions with respect to the horizontal direction, that is, at positions which are away from each other.

Further explaining in detail, according to the embodiment 5, the adhesive region is provided on the base edge portion side of the TAB tape 4 closer than the connecting region.

Further explaining more in detail, according to the stair shape of the TAB tape 4 in the embodiment 5, when a stress if applied from the outside to the solid state image pick-up element chip 1 in the vertical direction or oblique direction, since the stress can be distributed in the vertical direction and the oblique direction, the solid state image pick-up element chip 1 is difficult to be distorted. Thus, the stair shape of the embodiment 5 is more preferable in terms of a point that the stress from the outside can be lessened more than that case in the embodiment 4.

According to the embodiment 5, since the connecting region and the adhesive region are wired by the TAB tape 4 longer than the shortest distance in a manner similar to the embodiment 4, the stress which is further larger than those in the embodiments 1 and 2 can be lessened.

(Embodiment 6)

Figure 6:
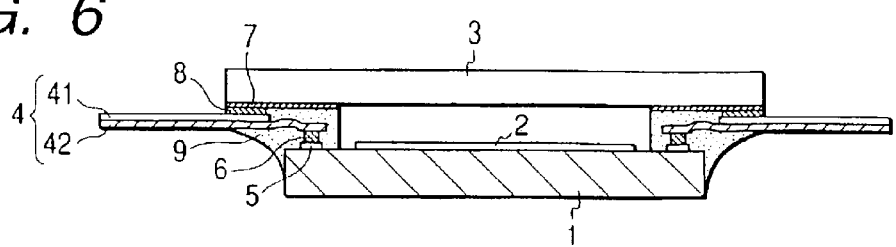
FIG. 6 is a schematic cross sectional view of a solid state image pick-up apparatus as an electronic part according to the sixth embodiment of the invention.

FIG. 6 is a schematic cross sectional view of a solid state image pick-up apparatus as an electronic part according to the embodiment 6 of the invention.

Explanation regarding the component elements designated by the same reference numerals as those of the component elements which have already been described above is omitted here.

According to the embodiment 6, in a manner similar to the embodiments 4 and 5, as a TAB tape 4 which is wired between the connecting region and the adhesive region, the TAB tape 4 longer than the shortest distance is used.

The embodiment 6 differs from the embodiments 4 and 5 with respect to the stair shape of the TAB tape 4. Specifically speaking, according to the embodiments 1, 2, 4, and 5, when the surface of the solid state image pick-up element chip 1 on which the solid state image pick-up element 2 has been formed is assumed to be the reference of the height, the connecting region of the TAB tape 4 and the adhesive region of the TAB tape 4 are formed so as to have the different heights. On the other hand, according to the embodiment, the connecting region of the TAB tape 4 and the adhesive region of the TAB tape 4 are formed so as to have the same height with respect to the vertical direction, and the TAB tape 4 forms the stair shape between the connecting region and the adhesive region. That is, the connecting region and the adhesive region are wired by the TAB tape 4 longer than the shortest distance.

Therefore, if the distance between the connecting region and the adhesive region in the horizontal direction in the embodiment 3 is the same as that in the embodiment 6, since the surplus TAB tape 4 can lessen the stress according to the embodiment 6, the stress can be lessened more than that in the embodiment 3.

Further, different from the embodiments 1, 2, 4, and 5, according to the embodiment 6, since the connecting region and the adhesive region are formed so as to have the same height from the solid state image pick-up element chip 1 with respect to the vertical direction, the thickness interval between the solid state image pick-up element chip 1 and protecting cap 3 can be made further thin.

Therefore, in addition to features such that the distortion of the functional element chip is hard to occur and the wiring member and the functional element chip are difficult to be peeled off, the miniaturized electronic part can be provided.

The manufacturing method of the electronic part of the invention will be described.

FIGS. 7A to 7E are schematic cross sectional views for explaining an outline of the manufacturing method of the electronic part of the invention.

Figure 8A:
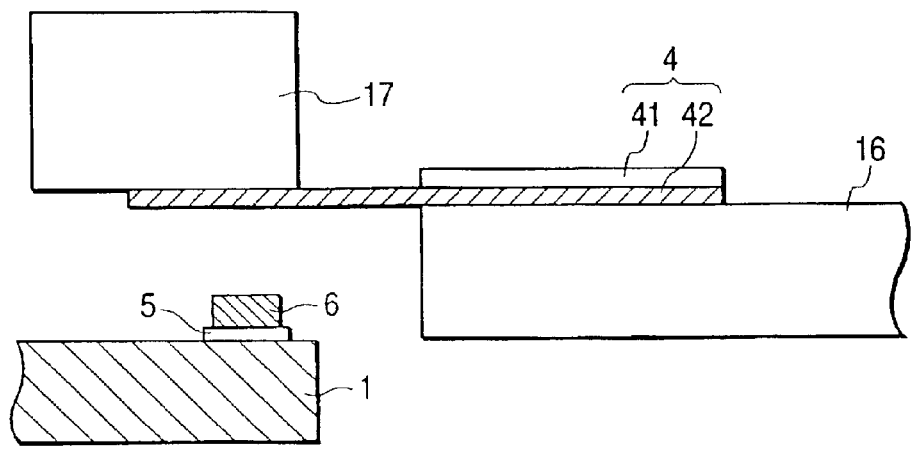
FIGS. 8A and 8B are step diagrams showing a manufacturing method of the solid state image pick-up apparatus as an electronic part according to the invention.
Figure 8B:
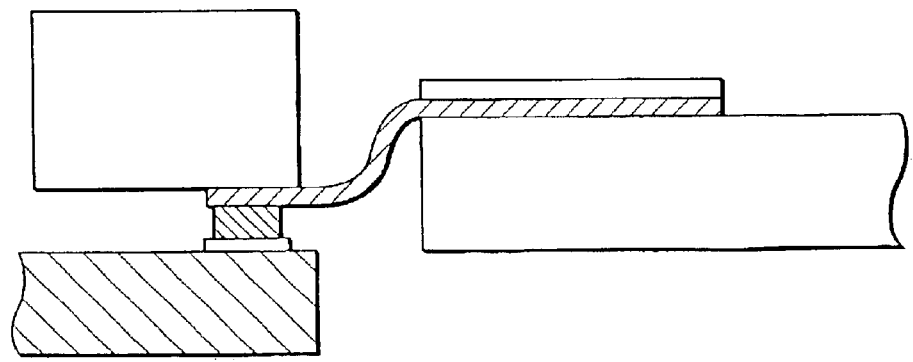

FIGS. 8A and 8B are schematic cross sectional views for explaining in detail manufacturing steps of forming a wiring member of an electronic part according to the invention is formed in a stair shape.

The same solid state image pick-up apparatus as that shown in FIG. 2 will be explained further in detail as an example.

Figure 7A:
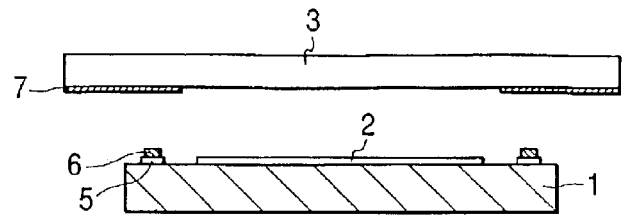
FIGS. 7A, 7B, 7C, 7D, and 7E are step diagrams showing a manufacturing method of the solid state image pick-up apparatus as an electronic part according to the invention.

First, as shown in FIG. 7A, the solid state image pick-up element chip 1 as a functional element chip and the protecting cap 3 as a protecting member 3 are prepared and, further, the solid state image pick-up element chip 1 and protecting cap 3 mentioned above are arranged with an interval therebetween.

Subsequently, the solid state image pick-up element chip 1 in which a microlens has been formed although it is not shown is constructed in a manner such that the solid state image pick-up element 2 serving as a functional element is formed on the surface which faces the protecting cap 3, the electrode pad 5 is further formed in the region which exists in the same surface as that mentioned above and in which the solid state image pick-up element 2 is not formed, and the bump 6 as a terminal is further formed on the solid state image pick-up element chip 1 via the electrode pad 5. As a forming method of the bump 6, for example, a stud bump method, a plating method, or the like is used.

Subsequently, the light shielding film 7 having a thickness of about 30 μm is formed onto the surface (on the side which faces the solid state image pick-up element chip 1) of the protecting cap 3 obtained by cutting, for example, a transparent glass substrate and chamfering the cut surface. The light shielding film 7 for shielding the light is made of a metal film or resin film. In case of the metal film, the film 7 is formed by using a sputtering method, an evaporation depositing method, or the like. In case of the resin film, it is formed by using a printing method, a dispensing method, or the like.

Subsequently, FIG. 7B will be described. The TAB tape 4 as a wiring member is constructed by the insulative film 41 and beam lead 42.

Figure 7B:

In the manufacturing step of FIG. 7B, the bump 6 and the beam lead 42 of the TAB tape 4 are electrically connected by an ultrasonic bonding method or the like while having a stair shape.

An example of the manufacturing step of forming the TAB tape 4 so as to have a stair shape will now be specifically explained with reference to FIGS. 8A and 8B.

Reference numeral 16 denotes a TAB tape holding tool and 17 a bonding tool.

Explanation of the component elements designated by the reference numerals which have already been mentioned is omitted here.

After the manufacturing step of FIG. 7A, as shown in FIG. 8A, the TAB tape 4 is fixed to the TAB tape holding tool 16 and held so as to form an interval between the front edge portion of the beam lead 42 and the bump 6. The interval between the front edge portion of the beam lead 42 and the bump 6 and interval between the TAB tape holding tool 16 and the bump 6 are adjusted in accordance with a stair shape to be formed. For example, if the user wants to form a stair shape such that the TAB tape 4 is arranged between the connecting region and the adhesive region in the vertical direction, the TAB tape holding tool 16 is come into contact with the bump 6 as close as possible. For example, if the user wants to form the stair shape of the electronic part of FIG. 2, the interval between the TAB tape holding tool 16 and bump 6 is formed as shown in the embodiment. Further, if the user wants to form the connecting region and the adhesive region so as to have the same height in the vertical direction as shown in FIG. 6, it is sufficient to narrow the interval between the front edge portion of the beam lead 42 and the bump 6 by moving the TAB tape holding tool 16 downward.

Subsequently, as shown in FIG. 8B, the bonding tool 17 is pressed and moved downward, thereby bonding the front edge portion of the beam lead 42 onto the bump 6. As a bonding, a bonding (thermo-compression bonding) by using, for example, an ultrasonic wave, heat, or the like is used. At this time, if the bonding tool 17 is pressed, moved downward, and bonded as it is, the beam lead 42 is curved from the portion fixed to the TAB tape holding tool 16 and bonded, so that the beam lead 42 has the stair shape as shown in FIG. 5. That is, such a stair shape is a shape which is suitable when the user wants to wire the connecting region and the adhesive region by the TAB tape 4 longer than the shortest distance. On the other hand, in order to obtain a stair shape adapted to wire the connecting region and the adhesive region at the shortest distance as shown in FIG. 2 from such a curved stair shape, in the manufacturing step of adhering the protecting cap 3 and TAB tape 4, which will be explained in FIG. 7C, the TAB tape 4 is adhered while applying a tension in the direction of a base edge portion side of the wiring matter, so that such a stair shape can be obtained. However, by using the stair shape such that the connecting region and the adhesive region are wired by the TAB tape 4 longer than the shortest distance, that is, for example, by the TAB tape 4 curved as shown in the embodiment, the stress larger than that in case of the stair shape of the TAB tape in FIG. 2 can be lessened. Moreover, since the manufacturing step of applying a tension when the TAB tape is adhered is also unnecessary, the electronic part can be formed by the small number of manufacturing steps. Consequently, such a shape can be regarded as a more preferable stair shape.

Referring to FIG. 8B again, it is preferable that the beam lead 42 is exposed in case of connecting by bonding.

As another method of electrically connecting the TAB tape 4 and bump 6, for example, there is a method of connecting them by an anisotropic conductive film or an anisotropic conductive paste, or the like. For example, there is a method which the anisotropic conductive film, or an anisotropic conductive paste is fed from a needle tip of a dispenser to the connecting region of the solid state image pick-up element chip 1 and TAB tape 4 and coated. In this case, the beam lead 42 of the TAB tape 4 is not always necessary to be exposed but the insulative film 41 can be also formed up to the front edge portion of the TAB tape 4. Therefore, since there is no need to add the manufacturing step of exposing the beam lead 42, the whole number of manufacturing steps can be reduced.

As a method other than the dispensing method, for example, the anisotropic conductive film can be also coated by a screen printing method or the like.

The manufacturing steps of the electronic part of the invention will be explained with reference to FIGS. 7C to 7E again.

Figure 7C:
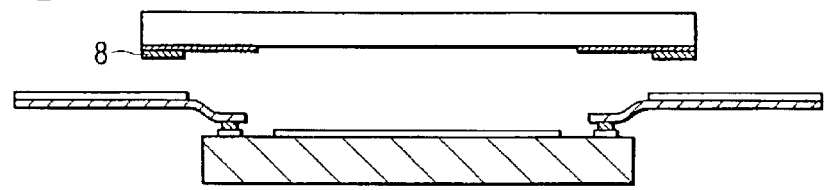

As shown in FIG. 7C, after completion of the manufacturing step in FIG. 7B, the adhesive material sheet 8 serving as an adhesive material is coated onto the surface (which faces the solid state image pick-up element chip 1) of the protecting cap 3. In the case where the light shielding film 7 has been formed on the protecting cap 3 as in the embodiment, the adhesive material sheet 8 can be also coated onto the protecting cap 3 through the light shielding film 7.

The adhesive material sheet 8 is made of a thermoplastic resin, a thermo-setting resin, or their mixed resin.

Figure 7D:
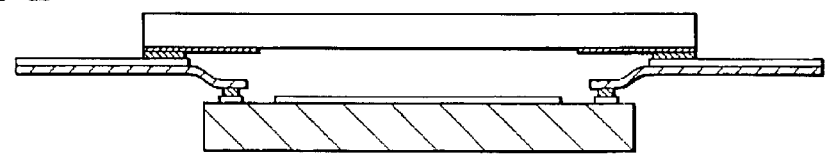

Subsequently, as shown in FIG. 7D, the protecting cap 3 and TAB tape 4 are adhered by the adhesive material sheet 8. Upon adhesion, for example, they can be also thermo-compression bonded. If the thin adhesive material sheet 8 is used as in the embodiment, the thickness between the protecting cap 3 and solid state image pick-up element chip 1 of the electronic part can be easily controlled and an overflow of the unnecessary adhesive material can be prevented.

Further, by fixing them by using the curing-type adhesive material, when a mechanical stress is applied from the outside to the wiring member, the stress is received by the adhesive region, so that the stress from the outside is hard to be transferred to the connecting region. Thus, the electrical connection is difficult to be disconnected.

Figure 7E:
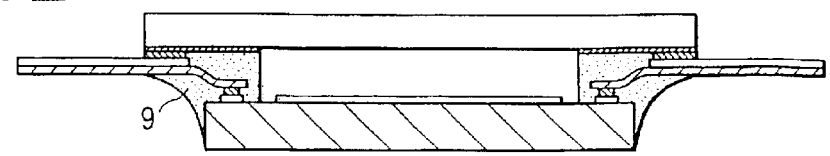

Finally, as shown in FIG. 7E, the beam lead 42 of the TAB tape 4 is covered with the sealing resin 9 as a sealing material lest it is exposed in an area near the connecting region. The sealing resin 9 is also filled into the gap formed between the connecting region and protecting cap 3.

For example, if the TAB tape 4 and solid state image pick-up element chip 1 are electrically connected by the anisotropic conductive film or an anisotropic conductive paste, or the like, it is necessary to form so as to cover the beam lead by the sealing resin 9. This is because the electrical connection becomes stable by covering the beam lead by the insulative sealing resin 9.

The sealing resin 9 has a flexibility and is made of a resin of, for example, the urethane system, silicone system, styrene system, ester system, vinyl chloride system, epoxy system, or the like.

Among the foregoing resins, for example, although there is a case where the urethane system, epoxy system, or the like is cured by applying heat and used as an adhesive material, in the embodiment, it is not cured by the resin in a state where it has the flexibility is used as a sealing resin 9.

Further, the sealing resin 9 can be also formed so as to surround the whole periphery of the solid state image pick-up element chip 1, that is, so as to seal the outer peripheral portions of the solid state image pick-up element chip 1 and protecting cap 3. In this case, the air-tightness among the TAB film 4, solid state image pick-up element chip 1, and protecting cap 3 is further held.

In FIGS. 7A and 7B of the embodiment, the manufacturing steps of FIGS. 7A and 7B are executed in a state where the protecting cap 3 and solid state image pick-up element chip 1 are preliminarily arranged so as to face each other with a predetermined interval. However, it is also possible to construct the manufacturing steps in a manner such that the solid state image pick-up element chip 1 and protecting cap 3 are arranged lest they face each other, the foregoing manufacturing steps are executed at places which are away from each other, and thereafter, the surface of the protecting cap 3 where the light shielding film 7 has been formed is allowed to face (with a predetermined interval) the surface of the solid state image pick-up element chip 1 where the solid state image pick-up element 2 has been formed. Specifically speaking, the light shielding film 7 is formed onto the protecting cap 3 at different positions. And the solid state image pick-up element 2, electrode pad 5, and bump 6 are formed in the solid state image pick-up element chip 1. Further, the TAB tape 4 having the stair shape is electrically connected to the solid state image pick-up element chip 1. After that, the surface of the protecting cap 3 with the light shielding film 7 is allowed to face the surface of the solid state image pick-up element chip 1 with the solid state image pick-up element 2 at a predetermined interval.

In the embodiment, although the adhesive material sheet 8 as an adhesive material is coated after the TAB tape 4 had the stair shape, it is also possible to construct in a manner such that at the stage of FIG. 7A, that is, at the stage of allowing the protecting cap 3 and solid state image pick-up element chip 1 to face each other at a predetermined interval, the adhesive material sheet 8 has already been coated onto the protecting cap 3 through the light shielding film 7. It is also possible to construct in a manner such that the solid state image pick-up element chip 1 and protecting cap 3 are arranged lest they face each other, the adhesive material sheet 8 is coated onto the protecting cap 3 through the light shielding film 7 at different positions, the stair-shaped TAB tape 4 is electrically connected to the solid state image pick-up element chip 1, and thereafter, the surface of the protecting cap 3 where the light shielding film 7 has been formed is allowed to face (with a predetermined interval) the surface of the solid state image pick-up element chip 1 where the solid state image pick-up element 2 has been formed.

As described above, the manufacturing method of the electronic part according to the invention includes: the step of electrically connecting the wiring member and the functional element chip; the step of forming the wiring member in a stair shape; and the step of adhering the wiring member formed in the stair shape onto the protecting member by using the adhesive material.

Therefore, the wiring member is adhered to the protecting member by using the adhesive material while having the stair shape and can lessen the stress which is caused by the difference between the coefficients of thermal expansion of the protecting member and the functional element chip, so that the electronic part in which the functional element chip is difficult to be distorted can be provided.

Moreover, the electronic part in which the electrical connection between the wiring member and the functional element chip is difficult to be disconnected can be provided.

In addition to the construction such that the wiring member is formed in the stair shape, by wiring the connecting region and the adhesive region by the wiring member longer than the shortest distance, an ability of further lessening the stress which is caused by the difference between the coefficients of thermal expansion is raised. Thus, the electronic part in which the electrical connection between the wiring member and the functional element chip is more difficult to be disconnected can be provided.

On the other hand, since the wiring member and the protecting member are fixed by using the curing-type and high elastic modulus adhesive material as an adhesive material for adhering them, even if a mechanical stress is applied from the outside to the wiring member, the stress is received by the adhesive region of the wiring member and the protecting member, so that the stress from the outside is not transferred to the connecting region of the wiring member and the functional element chip. Consequently, the electronic part in which the electrical connection is difficult to be disconnected can be provided.

By sealing the gap between the functional element chip and the protecting member by the flexible sealing material, the stress which is caused by the difference between the coefficients of thermal expansion between the functional element chip and the protecting member can be also lessened by the sealing resin. Thus, the electronic part in which the functional element chip is difficult to be distorted can be provided.

(Embodiment 7)

Figure 9A:
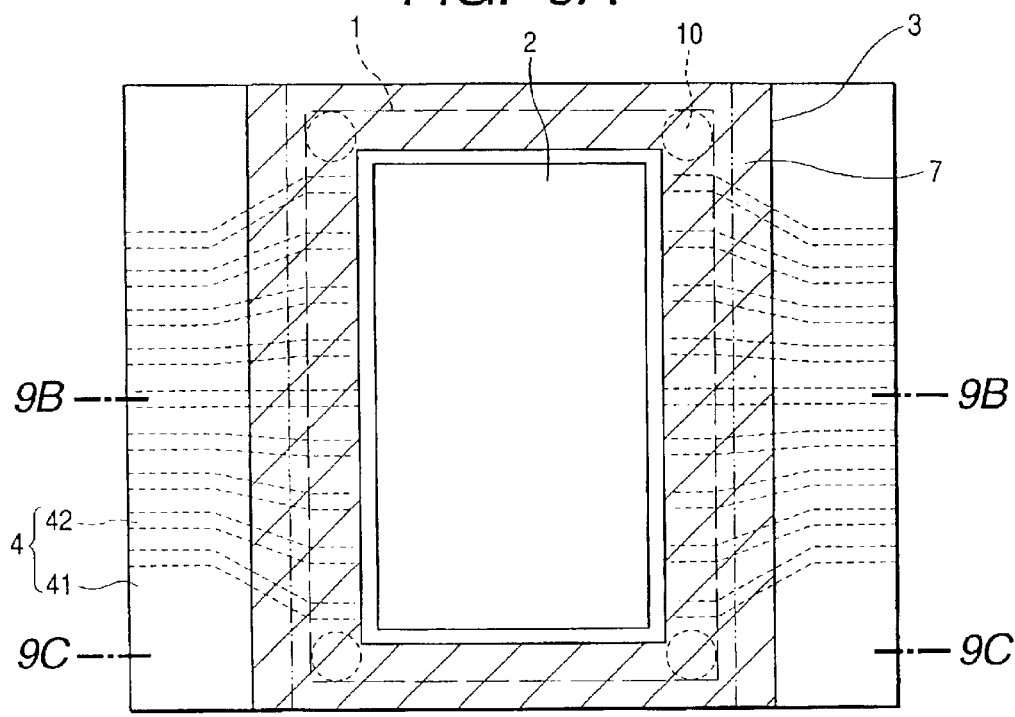
FIG. 9A is a top plan view of a solid state image pick-up apparatus as an electronic part according to the seventh embodiment of the invention.

FIG. 9A is a plan view of a solid state image pick-up apparatus as an electronic part according to the embodiment 7 of the invention.

Figure 9B:
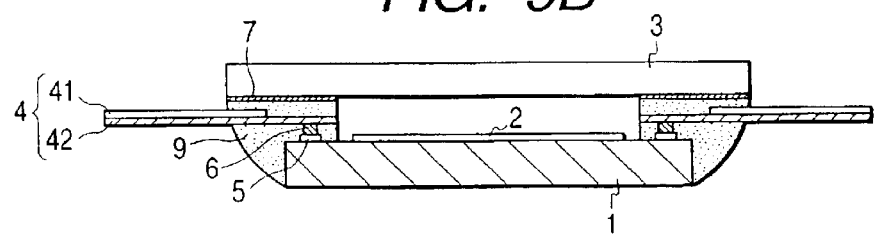
FIG. 9B is a cross sectional view taken along the broken line 9B—9B in FIG. 9A.

FIG. 9B is a cross sectional view taken along the broken line 9B—9B in FIG. 9A.

Figure 9C:
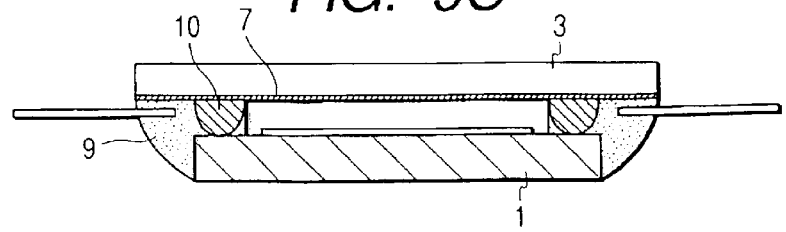
FIG. 9C is a cross sectional view taken along the broken line 9C—9C in FIG. 9A.

FIG. 9C is a cross sectional view taken along the broken line 9C—9C in FIG. 9A.

In FIGS. 9A and 9C, reference numeral 10 denotes a spacer.

Explanation regarding the component elements designated by the same reference numerals as those of the component elements which have already been described above is omitted here.

The embodiment 7 differs from the embodiments 1 to 5 with respect to a point that the spacer 10 is formed between the protecting cap 3 and solid state image pick-up element chip 1.

The spacer 10 is made of a thermo-setting resin, a thermoplastic resin, or their mixed resin. For example, a resin which is cured by ultraviolet rays, heat, or the like, or the like is suitable.

According to the electronic part of the embodiment, by arranging the resin spacer 10 as a spacer into the gap between the protecting cap 3 and solid state image pick-up element chip 1, the distance between the protecting cap 3 and solid state image pick-up element chip 1 is specified.

Further, the sealing resin 9 is filled into the gap so as to seal the outer peripheral portions of the solid state image pick-up element chip 1 and protecting cap 3. In this case, the air-tightness among the TAB film 4, solid state image pick-up element chip 1, and protecting cap 3 is further held.

It is desirable that the resin spacer 10 is made of the same resin as the sealing resin 9 or by a resin whose elastic modulus is close to that of the sealing resin 9 lest the reduction of the stress by the sealing resin 9 is obstructed while curing the resin. For example, if the sealing resin 9 has a flexibility and is made of a resin of the urethane system, silicone system, styrene system, ester system, vinyl chloride system, epoxy system, or the like, it is desirable to use the same resin or a resin whose elastic modulus is close to that of the sealing resin 9.

Further, the elastic modulus of the sealing resin 9 is optimized so as to lessen the thermo-stress which is applied to the solid state image pick-up element chip 1. In the embodiment, in case of using the resin having an elastic modulus of, for example, about 150 MPa, it is preferable that the resin spacer 10 also uses a resin having an elastic modulus of about 150 MPa.

As described above, by forming the spacer of the invention into the gap between the protecting member and the functional element chip of the electronic part, a variation of the gap between the protecting member and the functional element chip which has conventionally been the problem does not occur but the gap is set to a constant interval, so that the reliability of the electrical connection of the wiring member and the functional element chip is assured. Further, since parallelism between the protecting member and the functional element chip 1 can be held, optical characteristics are also improved.

Since the gap can be assured by the manufacturing steps which are simpler than those of the conventional method, the cheap electronic part having the constant gap can be provided.

A manufacturing method of the electronic part of the invention will now be described.

Figure 10A:
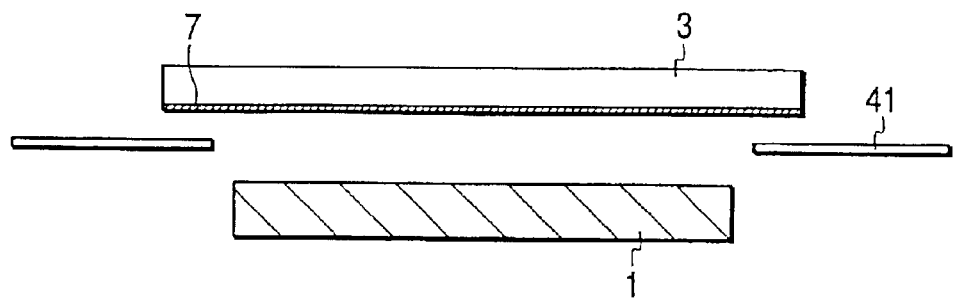
FIGS. 10A, 10B, and 10C are step diagrams showing a manufacturing method of the electronic part according to the seventh embodiment of the invention.
Figure 10B:
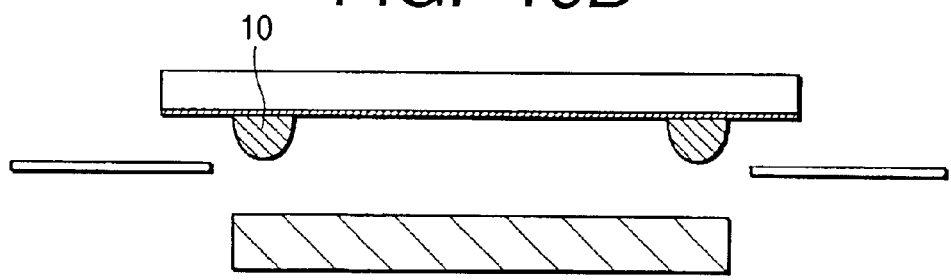
Figure 10C:
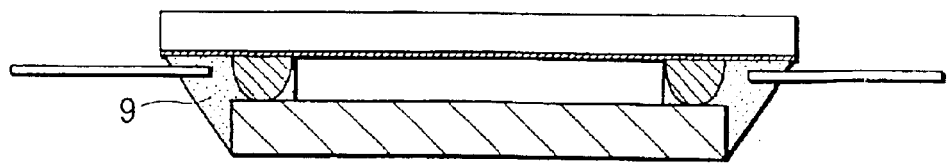

FIGS. 10A, 10B, and 10C are schematic cross sectional views for explaining an outline of the manufacturing method of the electronic part according to the invention.

Explanation regarding the component elements designated by the same reference numerals as those of the component elements which have already been described above is omitted here.

An example of the same solid state image pick-up apparatus as that shown in FIG. 9C will be described more in detail.

Specifically speaking, the manufacturing steps of forming the resin spacer 10 as a spacer shown in FIG. 9C will be explained First, as shown in FIG. 10A, the solid state image pick-up element chip 1 as a functional element chip and the protecting cap 3 as a protecting member 3 are prepared and, further, the solid state image pick-up element chip 1 and protecting cap 3 are arranged with an interval.

Subsequently, the microlens (not shown), the solid state image pick-up element 2 as a functional element, the electrode pad 5, the bump 6, and the like are formed.

Further, the light shielding film 7 for shielding the light is formed on the surface (of the protecting cap 3) which faces the solid state image pick-up element chip.

Subsequently, as shown in FIG. 10B, the resin spacer 10 as a spacer is formed to the protecting cap 3 through the light shielding film 7. The resin spacer 10 is coated with the resin by, for example the dispensing method or printing method and, thereafter, cured by using, for instance, ultraviolet rays, heat, or the like. Therefore, the resin spacer 10 can be made of a thermoplastic resin, a thermo-setting resin, or their mixed resin, or can be also made of another arbitrary resin so long as it is cured.

Moreover, the resin spacer 10 is arranged at a position where it does not obstruct the optical characteristics of the solid state image pick-up element 2. For example, in the embodiment, the resin spacer 10 is formed onto the protecting cap 3 through the light shielding film. In other words, the resin spacer 10 is not formed in a region where the light enters.

In the embodiment, the resin spacers 10 are arranged at four corners of the solid state image pick-up element chip 1.

Figure 11A:
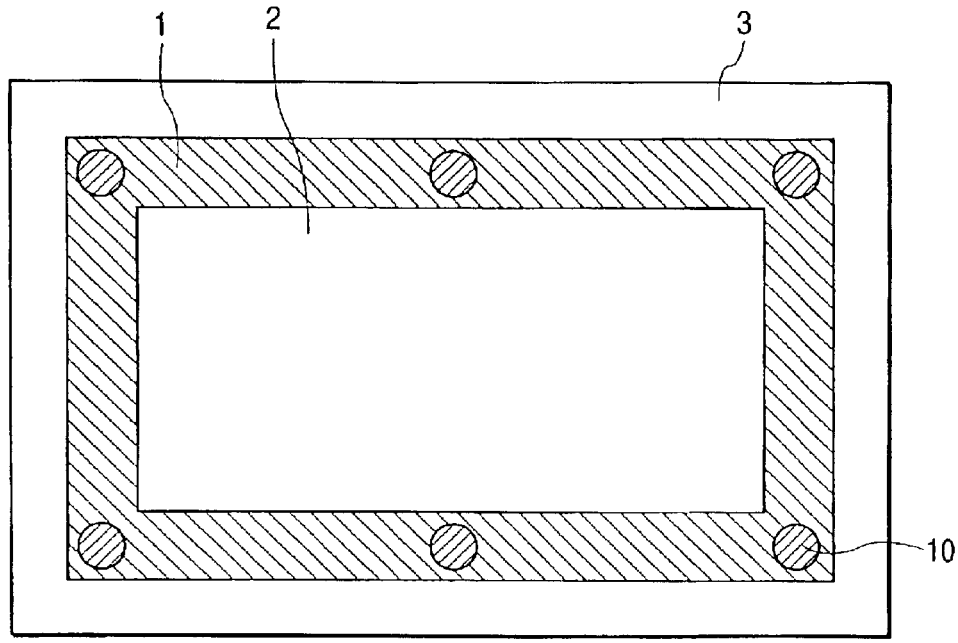
FIGS. 11A and 11B are diagrams showing another example of an arrangement of resin spacers in FIG. 9.
Figure 11B:
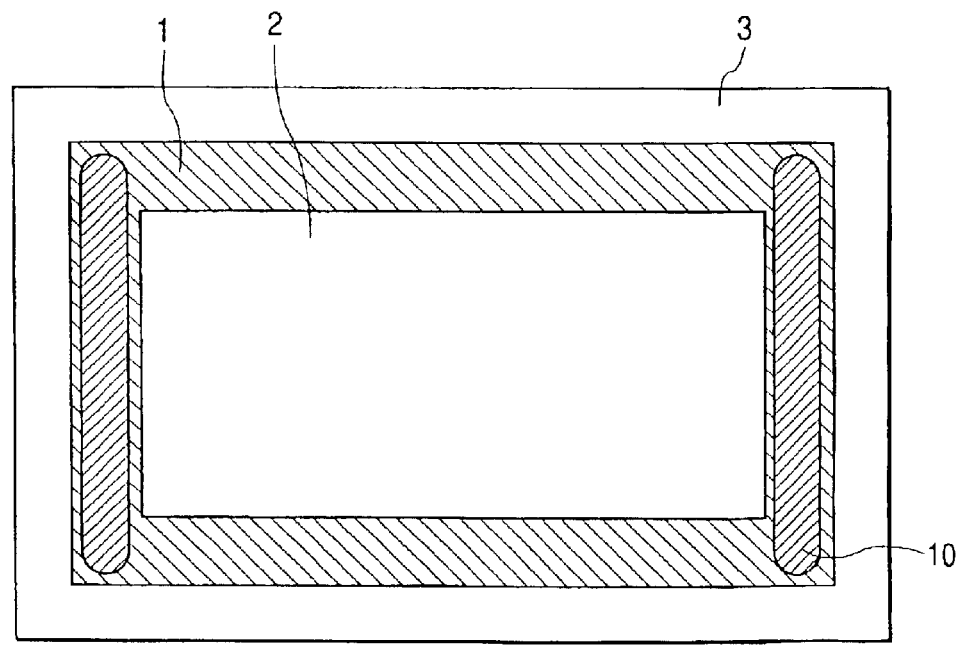

Other examples of arrangement of the resin spacers 10 are shown in FIGS. 11A and 11B, which will be explained hereinlater.

Finally, as shown in FIG. 10C, the gap between the protecting cap 3 and solid state image pick-up element chip 1 is filled with the sealing resin 9 as a sealing material and the insulative film of the TAB tape 4 is held by the resin 9.

If the sealing resin 9 has the flexibility and is made of a resin of, for example, the urethane system, silicone system, styrene system, ester system, vinyl chloride system, epoxy system, or the like, it is desirable to use the same resin or a resin whose elastic modulus is close to that of the resin spacers 10.

Therefore, the elastic modulus of the sealing resin 9 is optimized so as to lessen the thermo-stress which is applied to the solid state image pick-up element chip 1. In the embodiment, if the resin having an elastic modulus of, for example, about 150 MPa is used, it is preferable that the resin spacer 10 also uses a resin having an elastic modulus of, for example, about 150 MPa.

Electronic parts showing other examples of the arrangement of the resin spacers 10 will now be explained with reference to FIGS. 11A and 11B.

FIG. 11A is a plan view of a solid state image pick-up apparatus as an electronic part showing a state where the resin spacers 10 are arranged at six positions in the peripheral portion of the solid state image pick-up element chip 1. FIG. 11B is a plan view of a solid state image pick-up apparatus as an electronic part showing a state where the resin spacers 10 are arranged, for example, along the sides on the minor side of the solid state image pick-up element chip 1.

Explanation regarding the component elements designated by the same reference numerals as those of the component elements which have already been described above is omitted here.

First, FIG. 11A will be explained. The resin spacers 10 as spacers are arranged at six positions in the peripheral portion of the solid state image pick-up element chip 1 as a functional element chip. If it is not requested that the variation of the gap between the solid state image pick-up element chip 1 and protecting cap 3 is small, it is sufficient to improve mass productivity of the solid state image pick-up apparatus by arranging the resin spacers 10 as shown in FIG. 11A.

On the other hand, if it is strictly requested that the variation of the gap between the solid state image pick-up element chip and the protecting cap 3 is reduced, it is sufficient to arrange the resin spacers 10 to two minor sides among the four sides of the solid state image pick-up element chip 1 as shown in FIG. 11B.

If the resin spacers 10 are arranged, for example, along the sides on the major side of the solid state image pick-up element chip 1, the variation of the gap can be more strictly reduced than that in case of arranging the resin spacers 10 to the minor sides. A plurality of resin spacers 10 can be also arranged with proper intervals. It is sufficient to select proper arranging positions or the like in accordance with the object.

As described above, the embodiment includes the step of coating the resin serving as a spacer onto the gap between the frictional element chip 1 and protecting member 3 and, further, the step of curing the coated resin.

Consequently, the cheap electronic part in which the gap between the protecting member and the solid state image pick-up element chip is made constant and the reliability is high and the manufacturing method of such an electronic part can be provided.

(Embodiment 8)

Figure 12A:
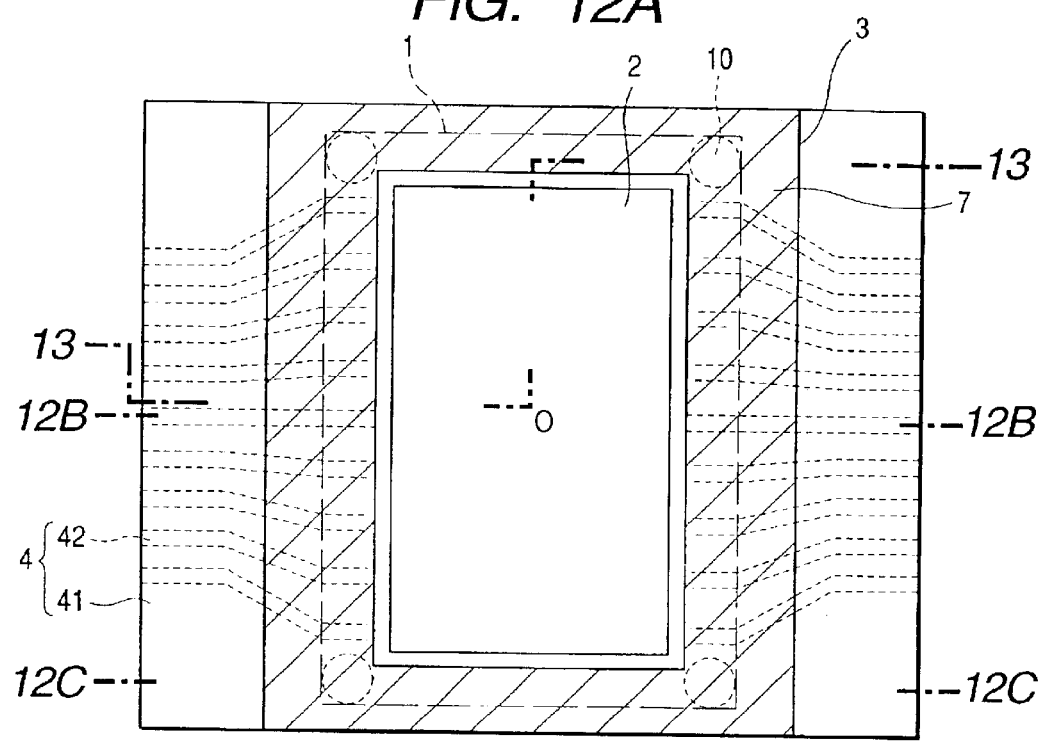
FIG. 12A is a top plan view of a solid state image pick-up apparatus as an electronic part according to the eighth embodiment of the invention.

FIG. 12A is a plan view of a solid state image pick-up apparatus as an electronic part according to the embodiment 8 of the invention.

Figure 12B:
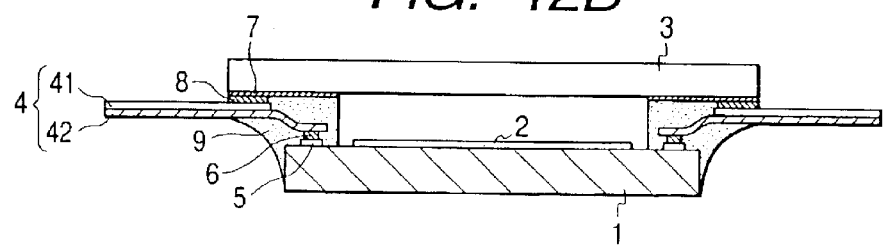
FIG. 12B is a cross sectional view taken along the broken line 12B—12B in FIG. 12A.
Figure 12C:
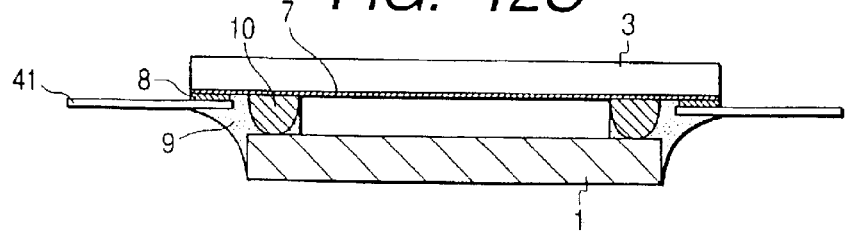
FIG. 12C is a cross sectional view taken along the broken line 12C—12C in FIG. 12A.

FIG. 12B is a cross sectional view taken along the broken line 12B—12B in FIG. 12A. FIG. 12C is a cross sectional view taken along the broken line 12C—12C in FIG. 12A.

Explanation regarding the component elements designated by the same reference numerals as those of the component elements which have already been described above is omitted here.

According to the solid state image pick-up apparatus of the embodiment, although not shown, a reflection preventing film, an optical low pass filter, or an infrared cutting filter can be solely laminated onto the protecting cap 3 or they can be combined and laminated thereon as necessary.

The embodiment 8 is an embodiment in which the resin spacers 10 as spacers mentioned in the embodiment 6 are arranged into the solid state image pick-up apparatus as an electronic part mentioned in the embodiment 4.

Explaining further in detail hereinbelow, as shown in FIG. 12B, the TAB tape 4 in the embodiment 7 has a stair shape, is electrically connected to the solid state image pick-up element chip 1 through the bump 6, and is adhered to the protecting cap 3 by the adhesive material sheet 8.

In the embodiment 8, between the connecting region and the adhesive region, the TAB tape 4 has a stair shape and, further, the connecting region and the adhesive region are wired by the TAB tape 4 longer than the shortest distance, thereby lessening the stress which is caused due to the difference between the coefficients of thermal expansion of the solid state image pick-up element chip 1 and protecting cap 3. Thus, the solid state image pick-up apparatus in which the electrical connection of the TAB tape 4 and solid state image pick-up element chip 1 is difficult to be disconnected can be provided.

As a stair shape which the TAB tape 4 of the solid state image pick-up apparatus of the embodiment can have, any of the stair shapes mentioned in the embodiments 1 to 6 can be used.

In order to make the gap between the protecting cap 3 and solid state image pick-up element chip 1 constant, the resin spacers 10 are arranged at four positions in the periphery of the solid state image pick-up element 2, that is, they are arranged in regions where they are not overlapped with the beam lead 42. Further, they are connected to the protecting cap 3 through the light shielding member 7 lest the optical characteristics are lost.

Although the resin spacers 10 are arranged at four positions of the solid state image pick-up element chip 1 in the embodiment, it is sufficient to select desired arranging positions of the spacers in accordance with the object as mentioned in the embodiment 7.

As described above, the electronic part of the embodiment has a feature such that since the wiring member has the stair shape, the functional element chip is difficult to be distorted and the electrical connection between the wiring member and the functional element chip is hard to be disconnected.

For example, if the wiring member and the protecting member are adhered by using the curing-type adhesive material, even if the mechanical stress is applied from the outside to the wiring member, the stress is hard to be transferred to the connecting region of the wiring member and the functional element chip, so that the electronic part in which the electrical connection is difficult to be disconnected can be provided.

Further, by arranging the spacers to the gap between the protecting member and the functional element chip, the gap is made constant and the cheap electronic part with high reliability can be provided.

A manufacturing method of the electronic part of the embodiment will now be described.

An example of the same solid state image pick-up apparatus as that shown in FIGS. 12A to 12C will be described further in detail.

FIGS. 13A to 13F show manufacturing steps of the electronic part of the embodiment by using the cross sectional view taken along the broken line 12C—12C in FIG. 12A.

Explanation regarding the component elements designated by the same reference numerals as those of the component elements which have already been described above is omitted here.

Figure 13A:
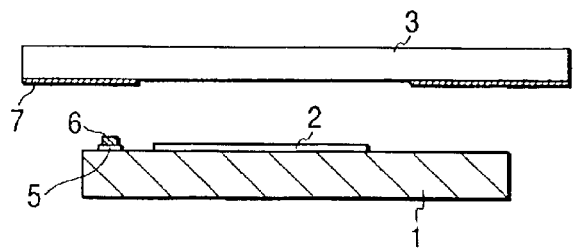
FIGS. 13A, 13B, 13C, 13D, 13E, and 13F are step diagrams showing a manufacturing method of the solid state image pick-up apparatus as an electronic part of the invention.

First, as shown in FIG. 13A, the solid state image pick-up element chip 1 and protecting cap 3 are prepared and arranged with an interval.

Subsequently, the solid state image pick-up element 2 is formed onto the surface (which faces the protecting cap 3) of the solid state image pick-up element chip 1 in which the microlens (not shown) has been formed. Further, the electrode pad 5 is formed into the area which exists in the same plane as that of the element 2 and in which the solid state image pick-up element 2 is not formed. Moreover, the bump 6 is formed onto the solid state image pick-up element chip 1 through the electrode pad 5. As a forming method of the bump 6, for example, a stud bump method, a plating method, or the like can be used.

Subsequently, the light shielding film 7 having a thickness of about 30 μm is formed onto the surface (on the side which faces the solid state image pick-up element chip 1) of the protecting cap 3 obtained by cutting, for example, a transparent glass substrate and chamfering the cut surface. The light shielding film 7 for shielding the light is made of a metal film or resin film. In case of the metal film, the film 7 is formed by using a sputtering method, an evaporation depositing method, or the like. In case of the resin film, it is formed by using a printing method, a dispensing method, or the like.

Subsequently, FIG. 13B will be described.

Figure 13B:
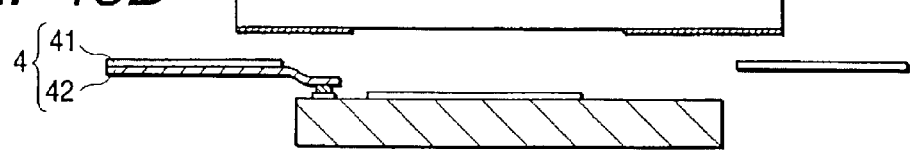

In the manufacturing step of FIG. 13B, the bump 6 and the beam lead 42 of the TAB tape 4 are electrically connected by an ultrasonic bonding method or the like while having a stair shape. As a method other than the ultrasonic bonding method, for example, a bonding by the heat or the like (thermo-compression bonding) is considered.

The TAB tape 4 was formed in a stair shape by using the manufacturing steps in FIGS. 8A and 8B mentioned in the embodiment 6. As mentioned above, by performing the manufacturing steps in FIGS. 8A and 8B, the connecting region and the adhesive region are automatically wired by the TAB tape 4 longer than the shortest distance.

As another method of electrically connecting the TAB tape 4 and bump 6, there is a method of connecting them by an anisotropic conductive film or an anisotropic conductive paste, or the like. For example, there is a method which the anisotropic conductive film or an anisotropic conductive paste is fed from a needle tip of a dispenser to the connecting region of the solid state image pick-up element chip 1 and TAB tape 4 and coated. In this case, since there is no need to add the manufacturing step of exposing the beam lead 42, the whole number of manufacturing steps can be reduced.

As a method other than the dispensing method, for example, the anisotropic conductive film can be also coated by a screen printing method or the like.

Figure 13C:
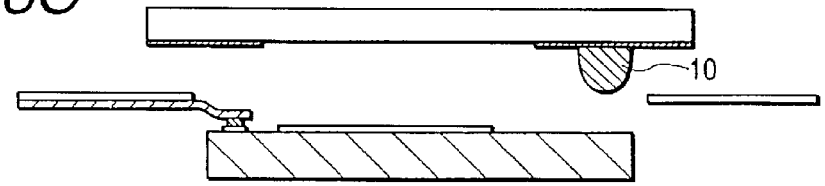

As shown in FIG. 13C, the resin spacer 10 as a spacer is arranged between the protecting cap 3 and solid state image pick-up element chip 1. If the light shielding film 7 is formed on the protecting cap 3 as in this embodiment, the resin spacer 10 can be also arranged via the light shielding film 7. For example, the resin is coated onto the protecting cap 3 by, for example, the dispensing method or the printing method, the resin spacer 10 cured by ultraviolet rays, heat, or the like, thereby forming the resin spacer 10. Therefore, it is desirable that the resin spacer 10 is made of a thermo-setting resin, a thermoplastic resin, their mixed resin, or a photo-curing resin.

Further, in the embodiment, the resin spacers 10 are arranged at positions where the optical characteristics of the solid state image pick-up element 2 are not lost. That is, the resin spacers 10 are formed onto the protecting cap 3 through the light shielding film 7. Although the resin spacers 10 are arranged at four corners of the solid state image pick-up element chip in the embodiment, the arranging positions are not limited to those positions. Proper arranging positions or the like of the resin spacers 10 can be selected in accordance with the object, respectively. For example, if the user wants to more strictly reduce the variation of the gap, the resin spacers 10 can be arranged along the sides on the major side of the solid state image pick-up element chip 1 instead of arranging them at four corners as in the embodiment.

Although the resin serving as resin spacers 10 is coated onto the protecting cap 3 and subsequently cured in the embodiment, it can be also coated onto the solid state image pick-up element chip 1 and subsequently cured.

The manufacturing steps in FIGS. 13B and 13C can be reversed. That is, after the resin spacers 10 are formed onto the protecting cap 3, the TAB tape 4 having the stair shape can be electrically connected to the solid state image pick-up element chip 1.

Figure 13D:
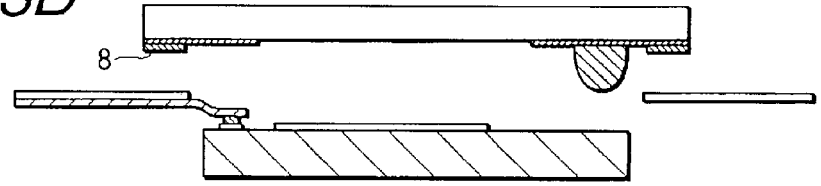

Subsequently, as shown in FIG. 13D, the adhesive material sheet 8 as an adhesive material is coated onto the surface of the protecting cap 3 which faces the solid state image pick-up element chip. If the light shielding film 7 was formed on the protecting cap 3 as in the embodiment, the adhesive material sheet 8 can be also coated onto the protecting cap 3 through the light shielding film 7.

The adhesive material sheet 8 is made of a thermoplastic resin, a thermo-setting resin, or their mixed resin.

Figure 13E:

Subsequently, as shown in FIG. 13E, the protecting cap 3 and TAB tape 4 are adhered by the adhesive material sheet 8. When adhering, for example, they can be also thermo-compression bonded. If the thin adhesive material sheet 8 is used as in the embodiment, the thickness between the protecting cap 3 of the electronic part and the solid state image pick-up element chip 1 can be easily controlled and the overflow of the unnecessary adhesive material can be prevented.

Figure 13F:
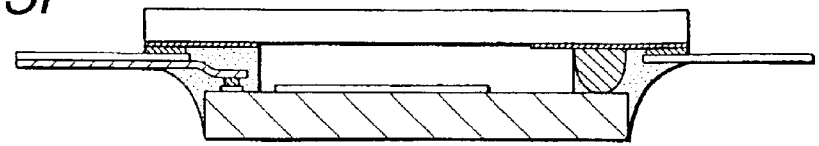

Finally, as shown in FIG. 13F, the beam lead 42 of the TAB tape 4 is covered with the sealing resin 9 in an area near the connecting portion lest it is exposed. The sealing resin 9 is also filled into the gap formed between the connecting region and the protecting cap 3.

For example, if the TAB tape 4 and solid state image pick-up element chip 1 are electrically connected by an anisotropic conductive film, an anisotropic conductive paste, or an anisotropic conductive resin, or the like, it is necessary to form so as to cover the periphery by the sealing resin 9. This is because by covering it with the insulative sealing resin 9, the electrical connection becomes stable.

The sealing resin 9 has flexibility and is made of, for example, the urethane system, silicone system, styrene system, ester system, vinyl chloride system, epoxy system, or the like.

Further, the sealing resin 9 can be formed so as to surround the whole periphery of the solid state image pick-up element chip 1, that is, so as to seal the outer peripheral portions of the solid state image pick-up element chip 1 and protecting cap 3. In this case, the air-tightness among the TAB film 4, solid state image pick-up element chip 1, and protecting cap 3 is further held.

In FIG. 13A of the embodiment, the manufacturing steps of FIGS. 13A and 13B as mentioned above are executed in a state where the protecting cap 3 and solid state image pick-up element chip 1 are arranged so as to face each other with a predetermined interval. However, it is also possible to construct the manufacturing steps in a manner such that the solid state image pick-up element chip 1 and protecting cap 3 are arranged lest they face each other, the foregoing manufacturing steps are executed at places which are away from each other, and thereafter, the surface of the protecting cap 3 where the light shielding film 7 has been formed is allowed to face (with a predetermined interval) the surface of the solid state image pick-up element chip 1 where the solid state image pick-up element 2 has been formed. Specifically speaking, the light shielding film 7 is formed onto the protecting cap 3 at different positions. And, the solid state image pick-up element 2, electrode pad 5, and bump 6 are formed in the solid state image pick-up element chip 1. Further, the TAB tape 4 having the stair shape can be electrically connected to the solid state image pick-up element chip 1. After that, the surface of the protecting cap 3 with the light shielding film 7 is allowed to face the surface of the solid state image pick-up element chip 1 with the solid state image pick-up element 2 at a predetermined interval.

In the embodiment, although the adhesive material sheet 8 as an adhesive material is coated after the TAB tape 4 has the stair shape, at the stage of FIG. 13A, in a state where the protecting cap 3 and solid state image pick-up element chip 1 face each other at a predetermined interval, the adhesive material sheet 8 can be preliminarily coated onto the protecting cap 3 through the light shielding film 7. It is also possible to construct in a manner such that the solid state image pick-up element chip 1 and protecting cap 3 are arranged lest they face each other, at different positions, the adhesive material sheet 8 is coated onto the protecting cap 3 through the light shielding film 7, the stair-shaped TAB tape 4 is electrically connected to the solid state image pick-up element chip 1, and thereafter, the surface of the protecting cap 3 having the light shielding film 7 is allowed to face (with a predetermined interval) the surface of the solid state image pick-up element chip 1 having the solid state image pick-up element 2.

Further, since the wiring member and the protecting member are fixed by using the curing-type and high elastic modulus adhesive material as an adhesive material for adhering them, even if a mechanical stress is applied from the outside to the wiring member, the stress is received by the adhesive region of the wiring member and the protecting member, so that the stress from the outside is not transferred to the connecting region of the wiring member and the functional element chip- Consequently, the electronic part in which the electrical connection is even more difficult to be disconnected can be provided.

As described above, the manufacturing method of the electronic part according to the invention includes: the step of electrically connecting the wiring member and the functional element chip; the step of forming the wiring member in a stair shape; the step of adhering the wiring member formed in the stair shape onto the protecting member by using the adhesive material; the step of coating the resin serving as a spacer between the functional element chip and the protecting member onto the protecting member or the functional element chip; and the step of curing the coated resin.

Therefore, since the wiring member having the stair shape is electrically connected to the functional element chip, the stress which is caused by the difference between the coefficients of thermal expansion can be lessened by such a stair shape. Further, since the gap between the functional element chip and the protecting member is made constant by the spacer, the electronic part which is strong against the stress and the stress from the outside can be provided by the cost-effective manufacturing method with high reliability. Further, by adhering the wiring member to the protecting member by using the curing-type adhesive material, the structure in which the stress from the outside is difficult to be transferred to the connecting region of the functional element chip and the wiring member can be obtained.

In each of the embodiments of the invention, a semiconductor photosensitive element such as a photodiode, a semiconductor light emitting element such as an LED, an element such as a micromirror, or the like can be used as a functional element. Therefore, a light emitting element chip such as LED or FED, a light modulation element chip such as a DMD, or the like can be used as a functional element chip other than the solid state image pick-up element chip. In the solid state image pick-up element chip, the photosensitive surface of the chip on which the semiconductor photosensitive element has been formed becomes the light operational surface. In the light emitting element chip or DMD, the light emitting surface or reflecting surface of the chip becomes the light operational surface.

(Embodiment 9)

Figure 14:
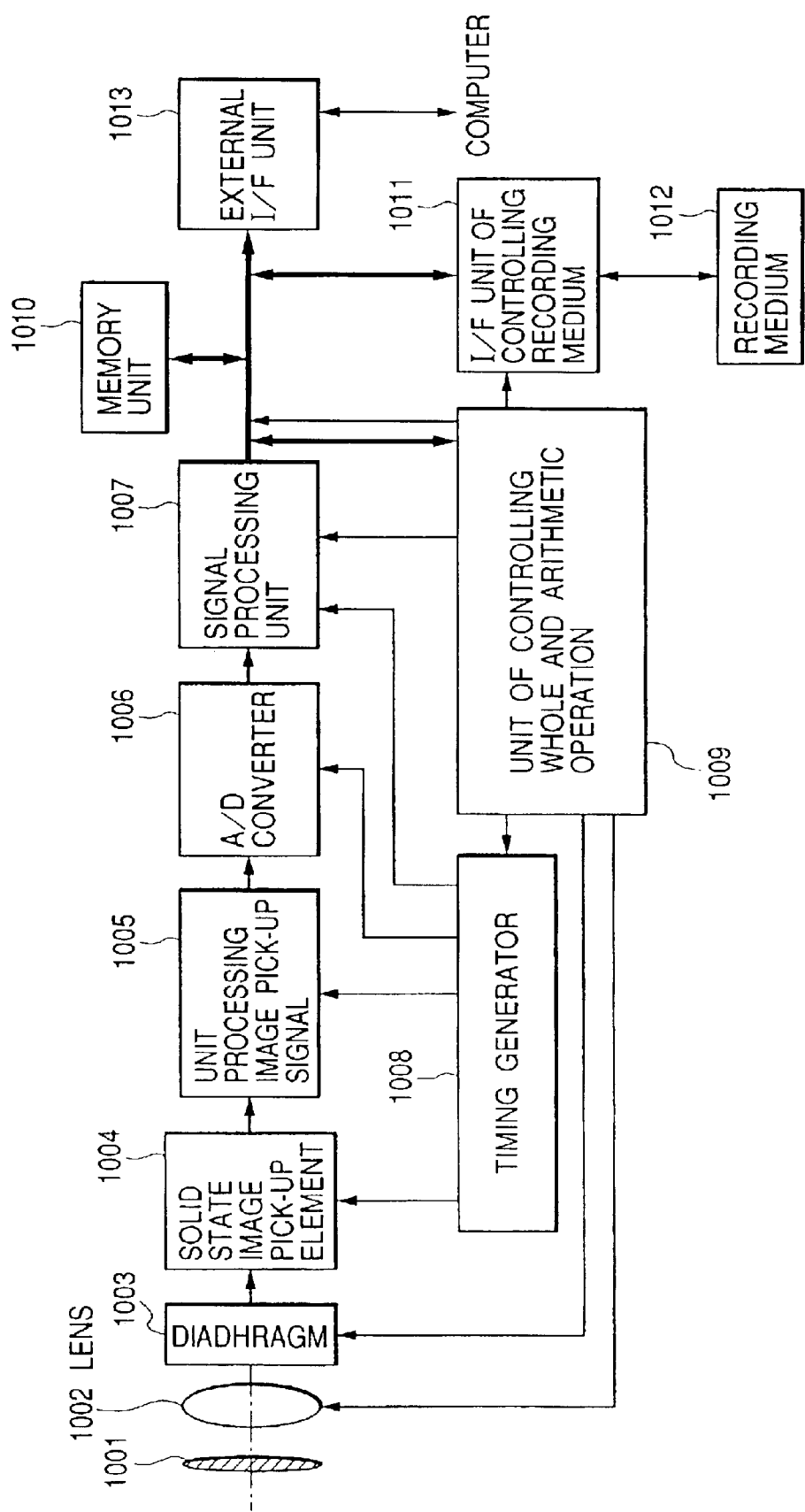
FIG. 14 is a constructional diagram of a solid state image pick-up system in the ninth embodiment of the invention.

FIG. 14 is a constructional diagram of a solid state image pick-up system using the solid state image pick-up apparatus as an electronic part of the invention.

In FIG. 14, reference numeral 1001 denotes a barrier serving as a lens protecting device and a main switch; 1002 a lens for forming an optical image of an object to be photographed onto a solid state image pick-up element 1004; 1003 a diaphragm for varying an amount of light transmitted through the lens; 1004 the solid state image pick-up element which is used for fetching the image of the photographing object formed by the lens 1002 as an image signal and which has 1007 already been described; 1005 an image pick-up signal processing unit of executing various processes such as correction, clamping, and the like to the image signal which is outputted from the solid state image pick-up element 1004; 1006 an A/D converter for analog/digital converting the image signal outputted from the solid state image pick-up element 1004; 1007 a signal processing unit of performing various correcting processes to the image data outputted from the A/D converter 1006 or compressing the data; 1008 a timing generator of generating various timing signals to the solid state image pick-up element 1004, image pick-up signal processing circuit 1005, A/D converter 1006, and signal processing unit 1007, respectively; 1009 a unit of executing various arithmetic operations and controlling the whole still video camera; 1010 a memory unit for temporarily storing the image data; 1011 a recording medium control interface (I/F) unit for recording or reading the image data onto/from a recording medium; 1012 a detachable recording medium such as a semiconductor memory or the like to/from which the image data is recorded or read out; and 1013 an external interface (I/F) unit of communicating with an external computer or the like.

Subsequently, the operation of the system of FIG. 14 will be described. When the barrier 1001 is opened, a main power source is turned on, a power source of a control system is turned on, and further, a power source of an image pick-up system circuit such as an A/D converter 1006 and the like is turned on. After that, in order to control an exposure amount, the unit 1009 opens the diaphragm 1003. A signal outputted from the solid state image pick-up element 1004 passes through the image pick-up signal processing unit 1005 and is outputted to the A/D converter 1006. The A/D converter 1006 A/D converts the signal and outputs the converted digital signal to the signal processing unit 1007. The signal processing unit 1007 arithmetically operates the exposure amount on the basis of the data by the unit 1009.

The brightness is determined on the basis of a result of a photometric operation. In accordance with the resultant brightness, the unit 1009 controls the diaphragm. Subsequently, on the basis of the signal outputted from the solid state image pick-up element 1004, high frequency components are extracted and a distance to the object is calculated by the unit 1009. After that, the lens 1002 is driven and whether the lens is in an in-focus state or not is discriminated. If it is determined that the lens is in an out-of-focus state, the lens 1002 is driven and the distance is measured again.

After the in-focus state is confirmed, the actual exposure is started. When the exposure is finished, the image signal outputted from the solid state image pick-up element 1004 is subjected to the correction or the like by the image pick-up signal processing unit 1005. The signal is further A/D converted by the A/D converter 1006. The converted digital signal passes through the signal processing unit 1007 and stored into the memory unit 1010 by the unit 1009. After that, the data stored in the memory unit 1010 passes through the recording medium control I/F unit 1011 by the control of the unit 1009 and recorded onto the detachable recording medium 1012 such as a semiconductor memory or the like. It is also possible to transmit the data passes through the external I/F unit 1013, directly input it to the computer or the like, and process an image.

What is claimed is:

1. An electronic part comprising:

a functional element chip in which a functional element has been formed;

a protecting member for protecting said functional element chip; and a spacer arranged between said functional element chip and said protecting member, wherein said spacer is made of a thermoplastic resin, a thermo-setting resin, their mixed resin, or a photo-curing resin.

2. A part according to claim 1, wherein said spacer is formed in a region of said functional element chip on which said functional element is not formed.

3. A part according to claim 1, wherein in said protecting member, a light shielding member for shielding light is formed at least in a part of a surface which faces said functional element chip.

4. A part according to claim 1, wherein said functional element chip is a solid state image pick-up element chip, a light emitting element chip, or a light modulating element chip.

5. A part according to claim 1, wherein said protecting member protects said functional element on an operational surface side of said functional element chip and is transparent.

6. An electronic part comprising:

a functional element chip in which a functional element has been formed;

a protecting member for protecting said functional element chip;

a spacer arranged between said functional element chip and said protecting member; and a sealing material for sealing said functional element chip and said protecting member.

7. A part according to claim 6, wherein said sealing material and said spacer are made of a same resin or resins whose elastic modulus are close.

8. A part according to claim 6, wherein said functional element chip is a solid state image pick-up element chip, a light emitting element chip, or a light modulating element chip.

9. A part according to claim 6, wherein said protecting member protects said functional element on an operational surface side of said functional element chip and is transparent.

10. An electronic part comprising:

a functional element chip in which a functional element has been formed; and a protecting member for protecting said functional element chip, wherein a spacer is arranged between said functional element chip and said protecting member, and wherein said protecting member has at least one of a reflection preventing film, an optical low pass filter, and an infrared cutting filter.

* * * * *